(12) United States Patent
Suda (10) Patent No.: US 8,436,980 B2
(45) Date of Patent: May 7, 2013

(54) ILLUMINATION OPTICAL APPARATUS, RELAY OPTICAL SYSTEM, EXPOSURE APPARATUS, AND DEVICE MANUFACTURING METHOD

(75) Inventor: Hiromi Suda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 801 days.

(21) Appl. No.: 12/061,854

(22) Filed: Apr. 3, 2008

(65) Prior Publication Data
US 2008/0259450 A1 Oct. 23, 2008

(30) Foreign Application Priority Data
Apr. 20, 2007 (JP) .................. 2007-112299

(51) Int. Cl.
*G03B 27/54* (2006.01)
*G02B 23/24* (2006.01)

(52) U.S. Cl.
USPC ........................................... 355/67; 359/434

(58) Field of Classification Search .............. 355/53, 355/55, 67; 359/432, 641, 663, 676, 780
See application file for complete search history.

(56) References Cited

U.S. PATENT DOCUMENTS

| | | | | |
|---|---|---|---|---|
| 3,982,253 | A * | 9/1976 | Goshima et al. | 396/548 |
| 4,318,594 | A * | 3/1982 | Hanada | 359/710 |
| 4,970,546 | A * | 11/1990 | Suzuki et al. | 355/53 |
| 5,912,725 | A * | 6/1999 | Tanitsu | 355/53 |
| 5,955,243 | A * | 9/1999 | Tanitsu | 430/311 |
| 5,986,744 | A * | 11/1999 | Kudo et al. | 355/55 |
| 6,081,320 | A * | 6/2000 | Tanitsu | 355/71 |
| 6,727,981 | B2 * | 4/2004 | Taniuchi et al. | 355/55 |
| 6,842,293 | B1 * | 1/2005 | Yin et al. | 359/641 |
| 2004/0239904 | A1 * | 12/2004 | Nishinaga | 355/53 |

FOREIGN PATENT DOCUMENTS

| JP | 2005-150541 A | 6/2005 |
|---|---|---|
| JP | 2005-203760 A | 7/2005 |

* cited by examiner

*Primary Examiner* — Steven H Whitesell Gordon
(74) *Attorney, Agent, or Firm* — Canon USA Inc IP Division (57) ABSTRACT

An illumination optical apparatus guides to an illumination object a light beam emitted from a light source. The illumination optical apparatus includes an enlarging optical system, disposed between the light source and the illumination object, and a reduction optical system, disposed between the enlarging optical system and the illumination object. The enlarging optical system is formed so that an image plane is disposed between the light source and the illumination object.

10 Claims, 5 Drawing Sheets

ILLUMINATION OPTICAL APPARATUS, RELAY OPTICAL SYSTEM, EXPOSURE APPARATUS, AND DEVICE MANUFACTURING METHOD

BACKGROUND OF THE INVENTION

1. Field of the Invention

The present invention relates to an illumination optical apparatus, a relay optical system, an exposure apparatus, and a device manufacturing method.

2. Description of the Related Art

A projection exposure apparatus has been hitherto used in manufacturing a fine semiconductor device of, for example, a semiconductor memory or a logic circuit, using photolithography (printing) techniques. The projection exposure apparatus projects a circuit pattern, drawn on a reticle (mask), onto, for example, a wafer by a projection optical system, to transfer the circuit pattern.

The minimum dimension (resolution) that can be transferred by the projection exposure apparatus is proportional to the wavelength of exposure light used in exposure, and is inversely proportional to the numerical aperture (NA) of the projection optical system. Therefore, the demand for finer semiconductor devices in recent years has caused the wavelength of the exposure light to be shortened, so that an excimer laser, such as a KrF excimer laser (having a wavelength of approximately 248 nm) or an ArF excimer laser (having a wavelength of approximately 193 nm), is used as an exposure light source.

The body of an exposure apparatus (such as an illumination optical system or a projection optical system) and a light source device (including an excimer laser as an exposure light source) are both large. (The light source device will hereafter be referred to as "excimer laser light source device.") Therefore, when the body of the exposure apparatus and the excimer laser light source device are set, they are often disposed apart from each other by a certain distance. Consequently, an illumination optical apparatus including an optical system (hereafter referred to as "relay optical system") that guides a substantially parallel light beam, supplied from the excimer laser light source device, to an entrance (light-incident position) of the body of the exposure apparatus is required.

The relay optical system is roughly divided into a conjugate light transmitting relay system and a parallel light transmitting relay system. The conjugate light transmitting relay system includes a 1× magnification relay optical system in which a laser emergent surface (output portion) of an excimer laser light source and an entrance of the body of the exposure apparatus are optically disposed substantially conjugately. The parallel light transmitting relay system guides a substantially parallel light beam from the laser emergent surface to the entrance of the body of the exposure apparatus, regardless of the optically substantially conjugate relationship between the laser emergent surface of the excimer laser light source and the entrance of the body of the exposure apparatus. These technologies are discussed in Japanese Patent Laid-Open No. 2005-203760.

However, in the 1× magnification relay optical system, which is a related conjugate light transmitting relay system, when the distance between the laser emergent surface and the entrance of the body of the exposure apparatus changes, the focal length of a lens must be changed by re-designing the 1× magnification relay optical system. Therefore, the design freedom with respect to the layout of the body of the exposure apparatus and the excimer laser light source device (hereafter referred to as "apparatus layout") is considerably low.

In the parallel light transmitting relay system, since the light beam that is supplied from the excimer laser light source device is spread by a slight divergence angle, the longer the distance for guiding the light beam (guiding distance), the larger the cross-sectional diameter of the light beam that reaches the entrance of the body of the exposure apparatus. Therefore, for an apparatus layout having a long guiding distance, vignetting of a portion of the light beam in the entrance of the body of the exposure apparatus occurs, thereby reducing illumination.

In addition, in the parallel light transmitting relay system, the magnitude of a Helmholtz-Lagrange invariant amount is increased. For example, the following technology is proposed. That is, in the technology, a plurality of diffractive optical elements are switchably disposed in an optical path of an illumination optical system, and a predetermined light intensity distribution (having an annular shape or a quadrupole shape) is formed at a Fourier transformation position of a surface (wafer surface) to be exposed. However, the light intensity distribution causes blurring of an image to occur due to a positional displacement of the image in accordance with the magnitude of an incident angle distribution of a light beam that is incident upon the diffractive optical elements.

Therefore, for forming the predetermined light intensity distribution with high precision, it is desirable to switchably dispose many diffractive optical elements, to make the diameter of the light beam that is incident upon the diffractive optical elements as small as possible within a range in which breakage does not occur, and to reduce the angle of incidence.

However, in the parallel light transmitting relay system, since the diameter of the light beam is enlarged while the light beam is guided up to the entrance of the body of the exposure apparatus, the diffractive optical elements become large, thereby reducing the number of diffractive optical elements that can be switchably disposed. In addition, even if an optical system that reduces the diameter of the light beam is disposed at an upstream side of the diffractive optical elements, compared to the conjugate light transmitting relay system, the angle of incidence of the light beam that is incident upon the diffractive optical elements becomes larger. This makes it considerably difficult to form the predetermined light intensity distribution with high precision at the Fourier transformation position of the surface to be exposed.

Accordingly, the parallel light transmitting relay system uses a large number of elements that restrict the apparatus layout. Therefore, as with the related conjugate light transmitting relay system, the design freedom with respect to the apparatus layout is low.

SUMMARY OF THE INVENTION

The present invention provides an illumination optical apparatus which has a high degree of freedom with respect to an apparatus layout.

According to a first aspect of the present invention, there is provided an illumination optical apparatus that guides to an illumination object a light beam emitted from a light source. The illumination optical apparatus includes an enlarging optical system, disposed between the light source and the illumination object, and a reduction optical system, disposed between the enlarging optical system and the illumination object. The enlarging optical system is formed so that an image plane is disposed between the light source and the illumination object.

According to a second aspect of the present invention, there is provided another illumination optical apparatus that guides to an illumination object a light beam emitted from a light source. The illumination optical apparatus includes an enlarging optical system and a reduction optical system. The enlarging optical system causes the light source and a predetermined plane to be optically conjugately disposed. The predetermined plane is disposed between the light source and the illumination object. In addition, the enlarging optical system enlarges the light beam that is emitted from the light source and forms an image in the predetermined plane. The reduction optical system reduces the size of the light beam used to form the image in the predetermined plane by the enlarging optical system, and guides the light beam whose size is reduced to the illumination object.

According to a third aspect of the present invention, there is provided a relay optical system that guides to an illumination object a light beam emitted from a light source. The relay optical system includes an enlarging optical system disposed between the light source and the illumination object. The enlarging optical system is formed so that an image plane is disposed between the light source and the illumination object.

According to a fourth aspect of the present invention, there is provided an exposure apparatus including an illumination optical system that illuminates a reticle using a light beam from a light source, a projection optical system that projects a pattern of the reticle onto a substrate, and a relay optical system that guides the light beam from the light source to the illumination optical system. The relay optical system includes an enlarging optical system, disposed between the light source and the illumination optical system, and a reduction optical system, disposed between the enlarging optical system and the illumination optical system. The enlarging optical system is formed so that an image plane is disposed between the light source and the illumination optical system.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Embodiments, features and aspects of the present invention will now be described in detail in accordance with the accompanying drawings. In each of the figures, corresponding parts are given the same reference numerals, and the same descriptions thereof will not be given below.

Figure 1:
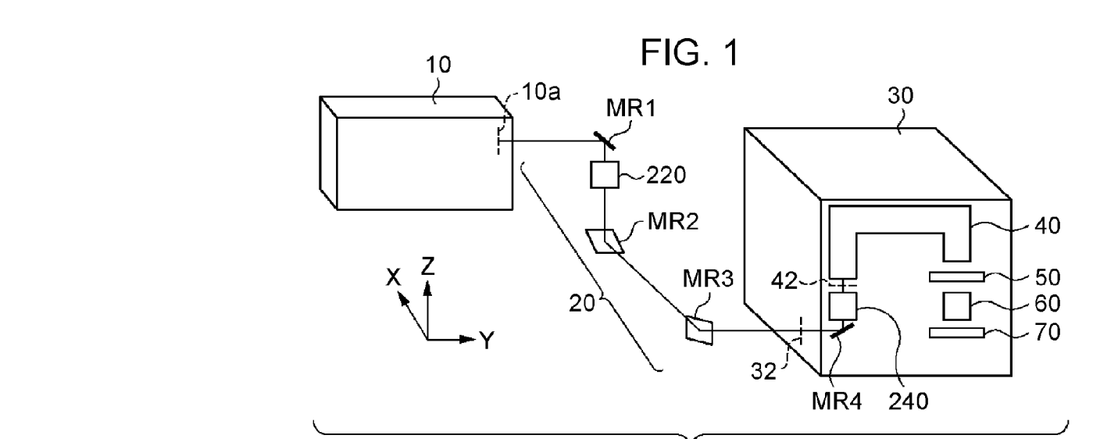
FIG. 1 is a schematic perspective view of an example structure of an exposure apparatus according to an exemplary embodiment of the present invention.

FIG. 1 is a schematic perspective view of a structure of an exposure apparatus 1 according to an embodiment of the present invention. In the embodiment, the exposure apparatus 1 is a projection exposure apparatus that forms a pattern of a reticle 50 onto a wafer 70 by exposure using a step-and-scan method. However, the exposure apparatus 1 can use a step-and-repeat method.

As shown in FIG. 1, the exposure apparatus 1 comprises a light source 10, a relay optical system 20, a chamber 30, an illumination optical system 40, a reticle stage (not shown), a projection optical system 60, and a wafer stage (not shown). The reticle 50 is placed on the reticle stage. The wafer 70 is placed on the wafer stage. The relay optical system 20 and the illumination optical system 40 constitute an illumination optical apparatus that guides a light beam from the light source 10 to an illumination object (such as the reticle 50).

The light source 10 uses an excimer laser, such as a KrF excimer laser (having a wavelength of approximately 248 nm) or an ArF excimer laser (having a wavelength of approximately 193 nm). However, the light source 10 is not limited to an excimer laser, so that, for example, an $F_2$ laser having a wavelength of approximately 157 nm may be used. In the embodiment, a substantially parallel light beam is emitted from an emergent surface 10a along a direction +Y.

The relay optical system 20 guides the light beam emitted from the emergent surface 10a of the light source 10. In the embodiment, the relay optical system 20 includes an enlarging imaging optical system 220, a reduction optical system 240, and a plurality of mirrors MR1 to MR4.

In the relay optical system 20, the light beam from the light source 10 is deflected to a direction −Z at the mirror MR1, and is incident upon the enlarging imaging optical system (enlarging optical system) 220. The light beam that has passed through the enlarging imaging optical system 220 is reflected to a direction −X at the mirror MR2, and is incident upon the mirror MR3. The light beam that has been polarized to a direction +Y at the mirror MR3 is guided to an opening 32 of the chamber 30.

The light beam guided to the opening 32 of the chamber 30 is reflected to a direction +Z at the mirror MR4, and is incident upon the reduction optical system 240. The reduction optical system 240 guides the light beam incident thereupon through the opening 32 of the chamber 30 to an entrance 42 of the illumination optical system 40. The light beam guided to the entrance 42 of the illumination optical system 40 is incident upon the illumination optical system 40.

Figure 2:
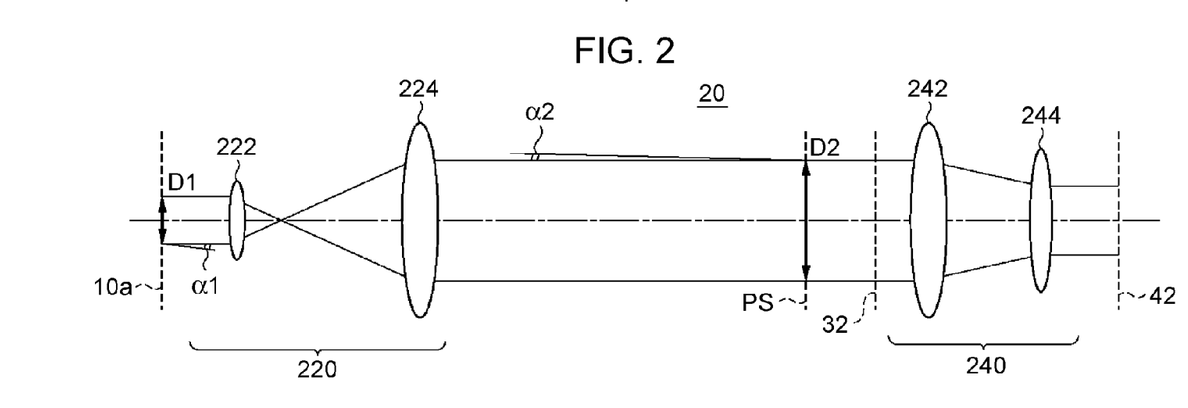
FIG. 2 is a schematic sectional view of an example structure of a reduction optical system and an enlarging imaging optical system of a relay optical system in the exposure apparatus shown in FIG. 1.

Here, the reduction optical system 240 and the enlarging imaging optical system 220 of the relay optical system 20 will be described in detail. FIG. 2 is a schematic sectional view of an exemplary structure of the reduction optical system 240 and the enlarging imaging optical system 220. In FIG. 2, the mirrors MR1 to MR4 are not shown.

Referring to FIG. 2, in the relay optical system 20, the enlarging imaging optical system 220 and the projection optical system 240 are disposed in that order from the emergent surface 10a side of the light source 10. The enlarging imaging optical system 220 is formed so that an image plane is formed between the light source 10 and the illumination optical system 40. That is, the enlarging imaging optical system 220 causes the light source 10 (emergent surface 10a) and a predetermined plane PS within an optical path of the relay optical system 20 (that is, between the light source 10 and the entrance 42 of the illumination optical system 40) to be optically conjugately disposed. The predetermined plane PS is situated at or in the vicinity of the opening 32. The enlarging imaging optical system 220 includes a lens 222 and a lens 224, and enlarges the light beam from the light source 10 to form an image in the predetermined plane PS. The enlarging imaging optical system 220 has a magnification that is greater than 1×. In particular, it is desirable that its magnification be greater than 2.5×.

For example, when the relay optical system 20 is a 1×-magnification imaging optical system, and when the distance between the light source 10 (emergent surface 10a) and the opening 32 of the chamber 30 changes, the focal length needs to be changed by changing the design of such imaging optical system. Therefore, the design of the imaging optical system needs to be changed each time the apparatus layout is changed, thereby reducing the degree of freedom with respect to the apparatus layout. To overcome this problem, in the embodiment, the enlarging imaging optical system 220 is caused to have a magnification that is greater than 1×, desirably, greater than or equal to 2.5×, to increase the degree of freedom with respect to the apparatus layout. In the embodiment, the apparatus layout refers to the layout of the light source 10 and the chamber 30.

An angle α2 and a diameter D2 of the light beam are expressed by the following Formulas (1) and (2):

$$\alpha 2 = \alpha 1/m1 \quad (1)$$

$$D2 = m1 \cdot D1 \quad (2)$$

where D1 is the diameter of the light beam from the light source 10 (emergent surface 10a), α1 is the angle between the optical axis and a light beam portion having the largest angle of divergence in the light beam from the light source 10, m1 is the magnification of the enlarging imaging optical system 220, α2 is the angle between the optical axis and a light beam portion having the largest angle of divergence when it is deflected by the enlarging imaging optical system 220, and D2 is the diameter of the light beam in the predetermined plane PS within the optical path of the relay optical system 20.

Due to illumination efficiency and durability problems, when a large number of apparatus layouts is to be used using one type of relay optical system, the diameter of the light beam is allowed to change by only approximately 10% with respect to an apparatus layout change ΔL (that is a change in the length of the optical path of the relay optical system). When the diameter of the light beam changes by a large amount, and the opening 32 of the chamber 30 is set small, the illumination efficiency is reduced as the length of the optical path of the relay optical system 20 (distance through which the light beam from the light source 10 is guided to the chamber 30) increases. In contrast, when the opening 32 of the chamber 30 is increased so as not to reduce the illumination efficiency, the energy density of the central portion of the light beam is increased. Therefore, durability of optical elements that the light beam is incident upon is not large enough.

In general, the laser used as the light source of the exposure apparatus has a diameter on the order of 15 mm, and has a maximum divergence angle on the order of 2 mrad. Therefore, when the magnification of the enlarging imaging optical system is 1×, an allowed value of ΔL at which the diameter of the light beam only changes by on the order of 10% is 0.75 m as indicated in the following Formula (3):

$$1.5 \div 0.002 = 0.75 \text{ m} \quad (3)$$

To make the allowed value of ΔL equal to ±5 m (range: 10 m), it is necessary to satisfy the conditions of the following Formulas (4) and (5). Therefore, the magnification m1 of the enlarging imaging optical system 220 is greater than or equal to 2.5×.

$$(\Delta L \cdot \tan \alpha 2)/D2 \leq 0.1 \quad (4)$$

$$(\Delta L \cdot \tan(\alpha 1/m1))/(m1 \cdot D1) \leq 0.1 \quad (5)$$

In the relay optical system 20, when the diameter of the light beam is greater than or equal to 150 mm, the diameter of the light beam is too large, and, therefore, is not a practical diameter. Consequently, for example, the diameter of the light beam becomes sensitive to slight movements of the mirrors. As a result, it is desirable that the magnification m1 of the relay optical system 20 be less than or equal to 10×. The diameter of the light beam emitted from the light source 10 need not have the values mentioned above. However, for making the allowed value of ΔL as large as possible, and for realistically guiding the light beam from the light source 10 to the chamber 30, it is desirable that the magnification of the enlarging imaging optical system 220 be in the range of from at least 2.5× to 10× at most. In other words, it is desirable that the relay optical system 20 guide the light beam having a diameter in the range of from at least 40 mm to 150 mm at most.

In the enlarging imaging optical system 220, the lens 222 and the lens 224 are formed so as to be drivable in the optical axis direction of the enlarging imaging optical system 220. That is, the enlarging imaging optical system 220 is formed so that the interval between the lenses 222 and 224 is variable. Changing the interval between the lenses 222 and 224 makes it possible to adjust the telecentricity (that is, the angle α2 in FIG. 2) of the light beam emitted from the enlarging imaging optical system 220. Accordingly, the lenses 222 and 224 function as a telecentricity adjusting optical system that adjusts the telecentricity of the light beam. Such a function is effective when the light beam from the light source 10 is not telecentric or the diameter of the light beam in the opening 32 of the chamber 30 is changed.

Figure 3A:
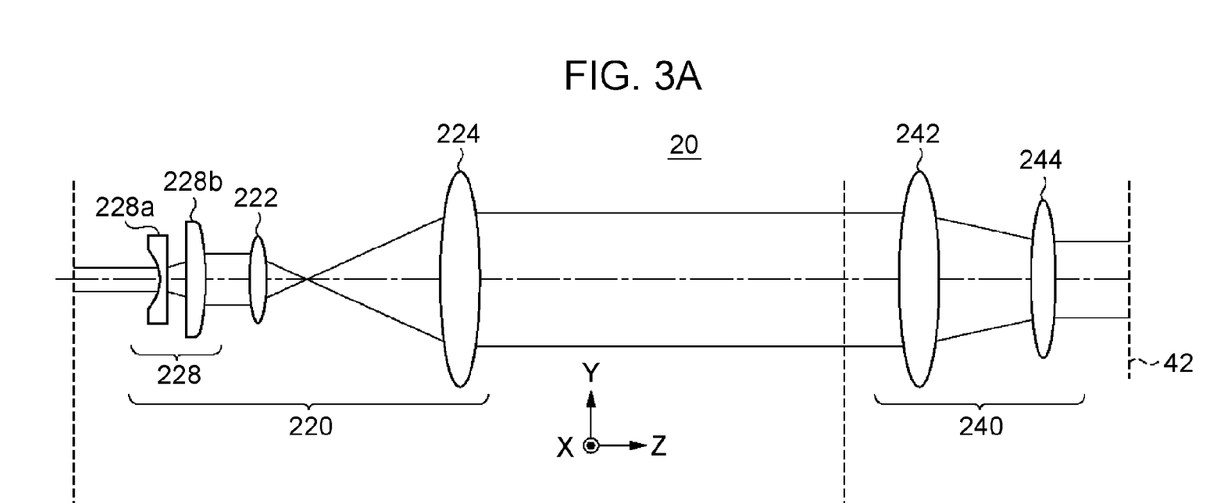
FIGS. 3A and 3B show a different example structures of the reduction optical system and the enlarging imaging optical system of the relay optical system shown in FIG. 1, with FIG. 3A being schematic sectional view thereof in a YZ plane, and FIG. 3B being a schematic sectional view thereof in an XZ plane.
Figure 3B:
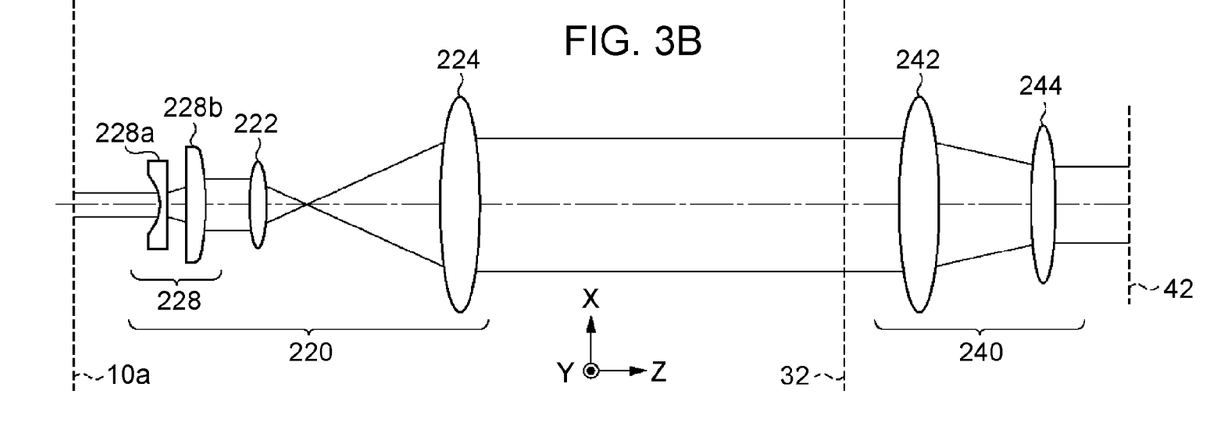

Further, as shown in FIGS. 3A and 3B, the enlarging imaging optical system 220 may include a beam expander 228 including a cylindrical concave lens 228a and a cylindrical convex lens 228b. In the enlarging imaging optical system 220, the cylindrical concave lens 228a and the cylindrical convex lens 228b are disposed between the light source 10 and the lens 224, and is drivable in the optical axis direction of the enlarging imaging optical system 220. That is, the beam expander 228 is formed so that the interval between the cylindrical concave lens 228a and the cylindrical convex lens 228b is variable. Here, FIGS. 3A and 3B show a different exemplary structure of the reduction optical system 240 and the enlarging imaging optical system 220, with FIG. 3A being a schematic sectional view thereof in a YZ plane, and FIG. 3B being a schematic sectional view thereof in an XZ plane.

The beam expander 228 functions as a cross-section adjusting optical system that adjusts the cross-sectional form of the light beam emitted from the light source 10 (emergence surface 10a). In the embodiment, the beam expander 228 only enlarges the direction Y of the substantially parallel light beam including a cross section of a rectangular form (having one side extending in the direction X and the other side extending in the direction Y) of the light beam emitted from the light source 10, to shape the light beam to one having a substantially rectangular form in cross section. The light beam emitted from the beam expander 228 is enlarged in the directions X and Y by the lenses 222 and 224, and is incident upon the opening 32 of the chamber 30.

The beam expander 228 can adjust the vertical-to-horizontal ratio of the light beam at the opening 32 of the chamber 30 by changing the interval between the cylindrical concave lens 228a and the cylindrical convex lens 228b. However, the units that adjust the vertical-to-horizontal ratio of the light beam at the opening 32 of the chamber 30 are not limited to the cylindrical concave lens 228a and the cylindrical convex lens 228b, so that they may be prisms or mirrors. For example, the vertical-to-horizontal ratio of the light beam at the opening 32 of the chamber 30 can be adjusted by changing the angle of the light beam by the prisms or the mirrors, and correcting the angle and the position of the light beam by the prisms or the mirrors again.

The reduction optical system 240 is disposed between the enlarging imaging optical system 220 and the illumination optical system 40, has a magnification that is less than 1×, and includes a lens 242 and a lens 244. The reduction optical system 240 reduces the size of the light beam, used to form an image in the predetermined plane PS by the enlarging imaging optical system 220, and guides this light beam to the illumination optical system 40. In the embodiment, the reduction optical system 240 is accommodated in the chamber 30, and reduces the size of the light beam incident thereupon from the opening 32 of the chamber 30 to guide the resulting light beam to the entrance 42 of the illumination optical system 40.

In this way, the relay optical system 20 can stably guide the light beam having a certain diameter to the entrance 42 of the illumination optical system 40 without changing the design of the optical system even if the apparatus layout (that is, the length of the optical path of the relay optical system 20) is changed. That is, the relay optical system 20 is insensitive to the distance between the light source 10 (emergent surface 10a) and the opening 32 of the chamber 30, so that it has a high degree of freedom with respect to the apparatus layout.

The chamber 30 contains the body of the exposure apparatus, that is, in the embodiment, the illumination optical system 40, the reticle stage (on which the reticle 50 is placed), the projection optical system 60, and the wafer stage (on which the wafer 70 is placed). The chamber 30 separates the light source 10 and the body of the exposure apparatus 1 from each other. The opening 32 (that is, the entrance of the body of the exposure apparatus) for transmitting the light beam guided from the light source 10 through the relay optical system 20 (enlarging imaging optical system 220) is formed in the chamber 30. For example, a parallel plate lens or a seal glass, which transmits the light beam from the light source 10, is disposed at the opening 32. Obviously, the inner portion of the chamber 30 is essentially a sealed space.

The illumination optical system 40 illuminates the reticle 50 using the light beam from the light source 10. As mentioned above, the light beam emitted from the light source 10 is incident upon the illumination optical system 40 from the entrance 42 of the illumination optical system 40 through the relay optical system 20.

Figure 4:
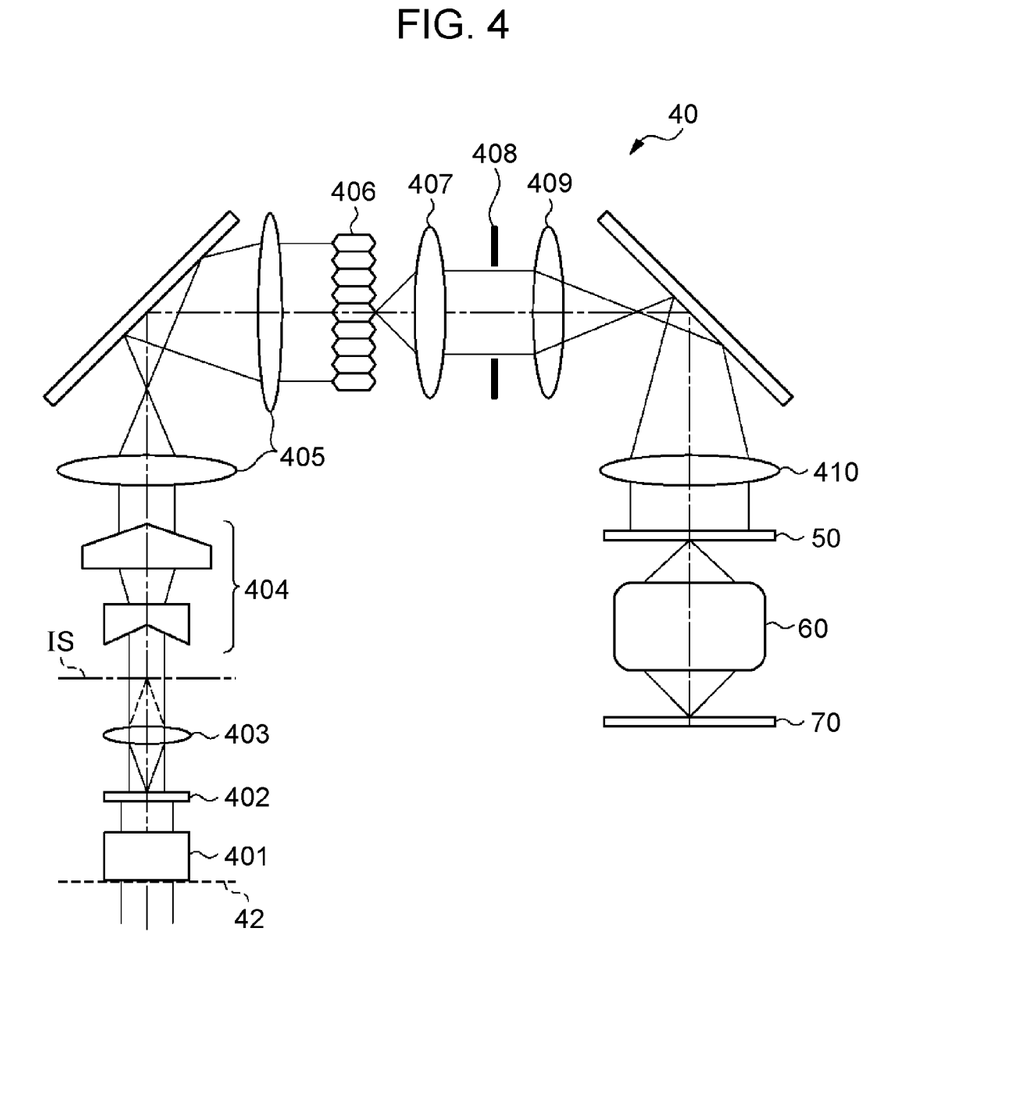
FIG. 4 shows an example structure of an optical system of the exposure apparatus shown in FIG. 1.

In the embodiment, as shown in FIG. 4, the illumination optical system 40 includes a beam converting optical system 401, a diffractive optical element 402, a condenser optical system 403, a prism 404, a zoom optical system 405, and a multiple beam generating unit 406. Further, the illumination optical system 40 includes a collimator lens 407, a masking blade 408, an imaging optical system 409, and an imaging optical system 410. Here, an exemplary structure of the illumination optical system 40 is shown in FIG. 4.

The beam converting optical system 401 converts the light beam incident thereupon from the entrance 42 of the illumination optical system 40 into a light beam having a predetermined angle of divergence. The beam converting optical system 401 includes, for example, a fly's eye lens and a microlens, and has the function of fixing the emergence angle of the light beam to a certain value regardless of the angle of incidence of the light beam.

The diffractive optical element 402 forms a predetermined light intensity distribution (having an annular shape or a quadrupole shape) in an illumination plane IS through the condenser optical system 403. For the diffractive optical element 402, for example, a computer hologram (amplitude distribution hologram or a phase distribution hologram) or a kinoform is used. In the embodiment, since the light beam having a predetermined diameter can be guided to the illumination optical system 40 by the relay optical system 20, the diameter of the light beam that is incident upon the diffractive optical element 402 can be made as small as possible within a range in which breakage does not occur, and the angle of incidence can be reduced. Since the diameter of the light beam that is incident upon the diffractive optical element 402 is not increased while the light beam from the light source 10 is being guided, it is possible to prevent the size of the diffractive optical element 402 from being increased, and to form many diffractive optical elements 402 so that they are switchable. Therefore, the diffractive optical element 402 can form an optimum light intensity distribution with high precision in accordance with the pattern of the reticle 50. The illumination plane IS is a plane in which the reticle 50 is disposed or a plane that is conjugate with the reticle 50. Accordingly, the illumination plane IS is not limited to the position shown in FIG. 4.

The condenser optical system 403 is formed so that an emergent surface of the diffractive optical element 402 and the illumination surface IS are in a Fourier transformation relationship. Even if the light beam from the light source 10 is varied, the angular distribution of the light beam that is incident upon the diffractive optical element 402 is maintained at all times at a certain angular distribution by the beam converting optical system 401. Therefore, the light intensity distribution that is formed at the position in the illumination plane IS can be maintained at all times at a certain light intensity distribution.

In the embodiment, the prism 404 comprises a pair of prisms having a circularly conical concave surface and a circularly conical convex surface, and allowing zooming. The prism 404 changes the annular rate of the annular light intensity distribution that is formed at the position in the illumination plane IS.

The zoom optical system 405 projects the light intensity distribution (light pattern), formed in the illumination plane IS, that is, forms images onto a light-incident surface of the multiple beam generating unit 406 with various magnifications.

The multiple beam generating unit 406 forms a light-source image that is in accordance with the light intensity distribution, formed in the illumination plane IS, onto an emergent surface thereof. The multiple beam generating unit 406 is formed of, for example, fly's eye lenses (comprising a plurality of very small lenses) or a fiber bundle. A surface light source, which comprises a plurality of point light sources, is formed at the emergent surface of the multiple beam generating unit 406.

Using the plurality of point light sources (formed at the multiple beam generating unit 406) as secondary light sources, the collimator lens 407 illuminates the reticle 50 through the masking blade 408, the imaging optical system 409, and the imaging optical system 410.

The masking blade 408 comprises, for example, four independently driven light-shielding plates, and limits an illumination area of the reticle 50.

The imaging optical systems 409 and 410 cause the masking blade 408 and the reticle 50 to be in an optically conjugate relationship.

The reticle 50 has a circuit pattern, and is supported and driven by the reticle stage (not shown). Diffraction light emitted from the reticle 50 is projected onto the wafer 70 through the projection optical system 60. Since the exposure apparatus 1 is a step-and-scan exposure apparatus, scanning the reticle 50 and the wafer 70 causes the pattern of the reticle 50 to be transferred onto the wafer 70.

The projection optical system 60 projects the pattern of the reticle 50 onto the wafer 70. In addition, the projection optical system 60 may be a refracting type, a reflecting-refracting type, or a reflecting type. Further, the projection optical system 60 is provided with a stop at its pupillary surface. The stop controls the numerical aperture of the projection optical system.

The wafer 70 is a substrate onto which the pattern of the reticle 50 is projected (transferred), and is supported and driven by the wafer stage (not shown). However, other substrates, such as a glass plate, may be used instead of the wafer 70. A resist is applied to the wafer 70.

During exposure, the light beam emitted from the light source 10 is guided to the illumination optical system 40 through the relay optical system 20. The light beam guided to the illumination optical system 40 illuminates the reticle 50. The projection optical system 60 causes the light beam that is transmitted through the reticle 50 and that is reflected by the pattern of the reticle 50 to form an image on the wafer 70.

According to the embodiment, it is possible to provide a relay optical system or an illumination optical system having a high degree of freedom with respect to the apparatus layout. In addition, as mentioned above, the relay optical system 20 of the exposure apparatus 1 can stably guide to the illumination optical system 40 a light beam having a certain diameter. Therefore, in the exposure apparatus 1, the illumination optical system 40 can form a light intensity distribution that is in accordance with the pattern of the reticle 50 with high precision. Consequently, the exposure apparatus 1 realizes excellent exposure performance. This makes it possible for the exposure apparatus 1 to provide a device (such as a semiconductor device, a liquid crystal display (LCD) device, an image pickup device (including a charge-coupled device (CCD)), or a thin-film magnetic head) having a high throughput and high quality.

Figure 5:
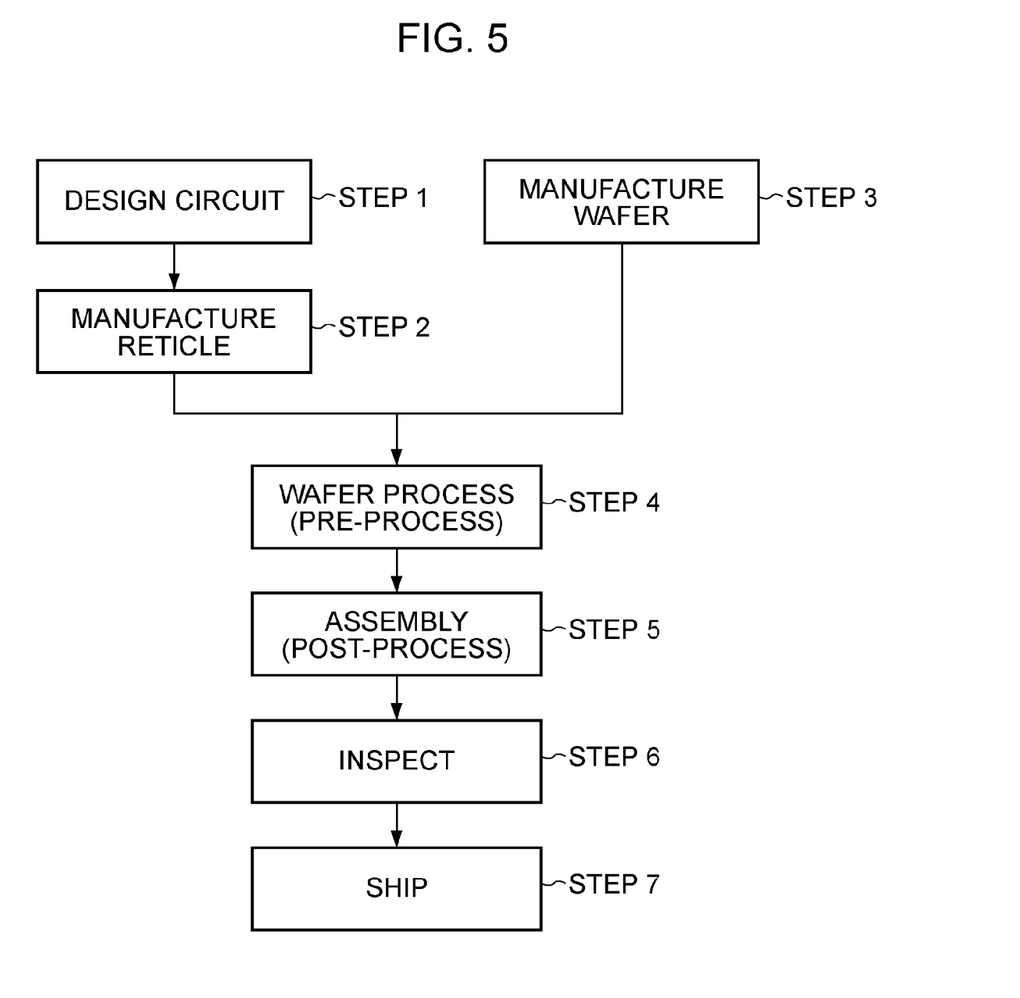
FIG. 5 is a flowchart for illustrating manufacturing of a device, according to an aspect of the present invention.
Figure 6:
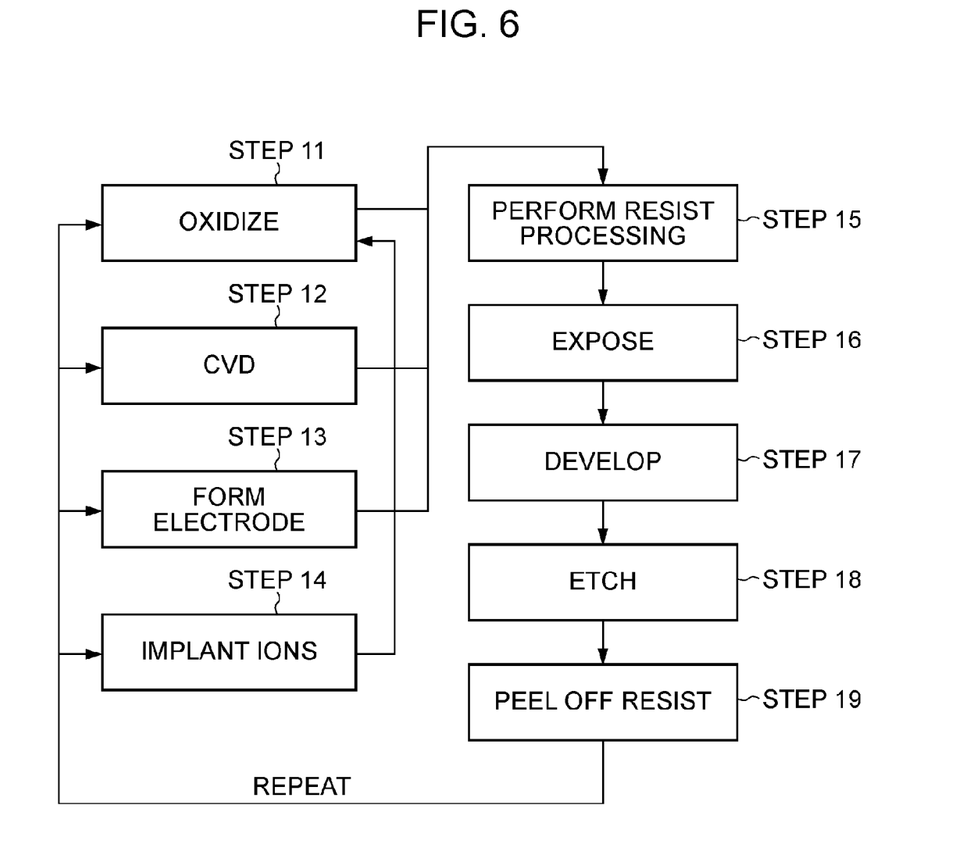
FIG. 6 is a detailed flowchart of a wafer process in Step 4 shown in FIG. 5, according to an aspect of the present invention.

Referring to FIGS. 5 and 6, an embodiment of a device manufacturing method using the exposure apparatus 1 will be described. FIG. 5 is a flowchart illustrating the device (semiconductor device or liquid crystal device) manufacturing method. Here, a semiconductor device manufacturing method will be taken as an example. In Step 1, a device circuit pattern is designed. Then, in Step 2, a reticle having the designed circuit pattern formed thereon is manufactured. In Step 3, a wafer is manufactured, using silicon or other such materials. In Step 4 (wafer process or pre-processing step), the reticle and the wafer are used to form the actual circuit onto the wafer using lithography techniques. Then, in Step 5 (assembly step or post-processing step), the wafer formed in Step 4 is formed into a semiconductor chip, wherein assembly (dicing, bonding) and packaging (of the chip) are performed. In Step 6, the semiconductor device formed in Step 5 is inspected by conducting operation confirmation and durability tests. After these steps, the semiconductor device is completed, and is shipped in Step 7.

FIG. 6 is a flowchart showing the above-described wafer process of Step 4 in more detail. In Step 11, the surface of the wafer is oxidized. Then, in Step 12 (chemical-vapor deposition (CVD) step), an insulation film is formed on the wafer surface. In Step 13, an electrode is formed on the wafer by, for example, evaporation. In Step 14, ions are implanted into the wafer. In Step 15 (resist processing step), a photosensitization agent is coated onto the wafer. In Step 16, the circuit pattern of the reticle is formed on the wafer by exposure using the exposure apparatus 1. In Step 17, the exposed wafer is developed. In Step 18, portions other than the developed resist image are etched. In Step 19 (resist peeling step), unwanted resist is removed from the wafer after the etching. Multiple circuit patterns are formed on the wafer by repeating the above-described steps. In the device manufacturing method, a device having a higher quality than that of a related device can be manufactured. Accordingly, the device manufacturing method using the exposure apparatus 1, and the device as a resulting product constitute aspects of the present invention.

While the present invention has been described with reference to exemplary embodiments, it is to be understood that the invention is not limited to the disclosed exemplary embodiments. Various modifications and changes can be made within the gist of the present invention. As many apparently widely different embodiments of the present invention can be made without departing from the spirit and scope thereof, it is to be understood that the invention is not limited to the specific embodiments thereof except as defined in the claims.

The entire disclosure of Japanese Patent Application No. 2007-112299 filed on Apr. 20, 2007, including claims, specification, drawings, and abstract are incorporated herein by reference in its entirety.

This application claims the benefit of Japanese Application No. 2007-112299 filed on Apr. 20, 2007, which is hereby incorporated by reference herein in its entirety.

What is claimed is:

1. An exposure apparatus comprising:
   an illumination optical system that illuminates a reticle using a light beam from a light source;
   a projection optical system that projects a pattern of the reticle onto a substrate;
   a relay optical system that guides the light beam from the light source to the illumination optical system; and
   a chamber configured to accommodate the illumination optical system, the chamber including an opening configured to guide the light beam from the light source to said illumination optical system,
   wherein the relay optical system includes:
   an enlarging imaging optical system disposed between the light source and the illumination optical system; and
   a reduction optical system disposed between the enlarging imaging optical system and the illumination optical system,
   wherein the enlarging imaging optical system is formed so that an image plane is disposed between the light source and the reduction optical system,
   wherein the enlarging imaging optical system causes the light source and the image plane of the enlarging optical system to be optically conjugately disposed,
   wherein the image plane of the enlarging imaging optical system is disposed between the enlarging imaging optical system and the reduction optical system, and
   wherein the image plane of the enlarging imaging optical system is situated at the opening or in the vicinity of the opening.

2. The exposure apparatus according claim 1, wherein the magnification of the enlarging imaging optical system is greater than or equal to 2.5×.

3. The exposure apparatus according to claim 1, wherein the enlarging imaging optical system includes a telecentricity adjusting optical system that adjusts the telecentricity of the light beam.

4. The exposure apparatus according to claim 1, wherein the enlarging imaging optical system includes a plurality of lenses, intervals between the lenses being variable.

5. The exposure apparatus according to claim 1, wherein a light beam having a constant diameter is emitted regardless of a variation in a length of an optical path of the illumination optical apparatus.

6. The exposure apparatus according to claim 1, further comprising a beam expander configured to guide the light beam emitted from the light source to the enlarging imaging optical system and adjust a vertical-to-horizontal ratio of the light beam.

7. The exposure apparatus according to claim 1, wherein the reduction optical system is configured to reduce the size of the light beam used to form the image in the image plane by the enlarging imaging optical system, and configured to guide the light beam whose size is reduced to the illumination optical system.

8. The exposure apparatus according to claim 1, wherein an optical element for transmitting light from the light source is disposed in the opening.

9. The exposure apparatus according to claim 8, wherein the optical element is a seal glass or a flat plate.

10. A device manufacturing method utilizing an exposure apparatus which includes,
an illumination optical system that illuminates a reticle using a light beam from a light source;
a projection optical system that projects a pattern of the reticle onto a substrate;
a relay optical system that guides the light beam from the light source to the illumination optical system; and
a chamber configured to accommodate the illumination optical system, the chamber including an opening configured to guide the light beam from the light source to said illumination optical system,
wherein the relay optical system includes,
an enlarging imaging optical system disposed between the light source and the illumination optical system; and
a reduction optical system disposed between the enlarging imaging optical system and the illumination optical system,
wherein the enlarging imaging optical system is formed so that an image plane is disposed between the light source and the reduction optical system,
wherein the enlarging imaging optical system causes the light source and the image plane of the enlarging optical system to be optically conjugately disposed,
wherein the image plane of the enlarging imaging optical system is disposed between the enlarging imaging optical system and the reduction optical system, and
wherein the image plane of the enlarging imaging optical system is situated at the opening or in the vicinity of the opening,
the method comprising:
exposing a substrate using the exposure apparatus; and
developing the exposed substrate.

* * * * *